(12) United States Patent
Okuzawa et al.

(10) Patent No.: US 8,050,045 B2
(45) Date of Patent: Nov. 1, 2011

(54) ELECTRONIC COMPONENT AND METHOD OF MANUFACTURING THE SAME

(75) Inventors: Nobuyuki Okuzawa, Tokyo (JP); Makoto Yoshida, Tokyo (JP)

(73) Assignee: TDK Corporation, Tokyo (JP)

( * ) Notice: Subject to any disclaimer, the term of this patent is extended or adjusted under 35 U.S.C. 154(b) by 639 days.

(21) Appl. No.: 11/499,742

(22) Filed: Aug. 7, 2006

(65) Prior Publication Data

US 2007/0040163 A1 Feb. 22, 2007

(30) Foreign Application Priority Data

Aug. 18, 2005 (JP) ................................. 2005-237664

(51) Int. Cl.
*H05K 1/18* (2006.01)

(52) U.S. Cl. .................. 361/763; 361/306.3; 361/321.2; 361/330; 361/704; 336/192; 336/200; 427/333; 29/830; 333/131; 333/181; 333/185; 428/138

(58) Field of Classification Search .................. 361/763, 361/271, 306.3, 321.2, 330, 704; 336/192, 336/200; 427/333; 29/830; 333/131, 181, 333/185; 428/138
See application file for complete search history.

(56) References Cited

U.S. PATENT DOCUMENTS

| | | | | |
|---|---|---|---|---|
| 4,746,557 A | * | 5/1988 | Sakamoto et al. | 428/138 |
| 4,904,967 A | * | 2/1990 | Morii et al. | 333/185 |
| 4,947,286 A | * | 8/1990 | Kaneko et al. | 361/321.2 |
| 5,126,971 A | * | 6/1992 | Lin et al. | 365/171 |
| 5,349,743 A | | 9/1994 | Grader et al. | |
| 5,572,179 A | * | 11/1996 | Ito et al. | 336/200 |
| 5,652,157 A | * | 7/1997 | Hirano et al. | 438/182 |
| 6,050,829 A | * | 4/2000 | Eldridge et al. | 439/67 |
| 6,207,234 B1 | * | 3/2001 | Jiang | 427/333 |
| 6,301,114 B1 | * | 10/2001 | Ootani | 361/704 |
| 6,356,181 B1 | | 3/2002 | Kitamura | |
| 6,459,048 B1 | * | 10/2002 | Sakai et al. | 174/261 |
| 6,542,379 B1 | * | 4/2003 | Lauffer et al. | 361/793 |
| 6,564,448 B1 | * | 5/2003 | Oura et al. | 29/830 |
| 6,593,841 B1 | * | 7/2003 | Mizoguchi et al. | 336/200 |
| 6,707,682 B2 | * | 3/2004 | Akiba et al. | 361/763 |

(Continued)

FOREIGN PATENT DOCUMENTS

CN 1649043 A 8/2005

(Continued)

OTHER PUBLICATIONS

Jul. 13, 2010 Office Action issued in Japanese patent application No. 2005-237664 (with translation).

*Primary Examiner* — Xiaoliang Chen
(74) *Attorney, Agent, or Firm* — Oliff & Berridge, PLC

(57) ABSTRACT

The invention relates to a surface mount type electronic component mounted on a printed circuit board or hybrid IC (HIC) and a method of manufacturing the same and provides an electronic component which can be formed with a small size and a low height at a low cost and a method of manufacturing the same. A common mode choke coil as the electronic component has an overall shape in the form of rectangular parallelepiped that is provided by forming an insulation layer, a coil layer (not shown) formed with a coil conductor, and external electrodes electrically connected to the coil conductor in the order listed on a silicon substrate using thin film forming techniques. The external electrodes are formed to spread on a top surface (mounting surface) of the insulation layer.

12 Claims, 3 Drawing Sheets

U.S. PATENT DOCUMENTS

| | | | |
|---|---|---|---|
| 6,727,792 B2 * | 4/2004 | Amada et al. | 336/192 |
| 6,806,050 B2 * | 10/2004 | Zhou et al. | 435/6 |
| 6,825,748 B1 * | 11/2004 | Ibata et al. | 336/200 |
| 6,956,240 B2 * | 10/2005 | Yamazaki et al. | 257/79 |
| 6,965,280 B2 * | 11/2005 | Chen | 333/131 |
| 7,060,192 B2 * | 6/2006 | Yuzhakov et al. | 216/11 |
| 7,095,053 B2 * | 8/2006 | Mazzochette et al. | 257/81 |
| 7,212,095 B2 * | 5/2007 | Sato et al | 336/200 |
| 7,402,897 B2 * | 7/2008 | Leedy | 257/678 |
| 7,663,225 B2 * | 2/2010 | Kudo et al. | 257/700 |
| 2001/0019176 A1 * | 9/2001 | Ahiko et al. | 257/777 |
| 2002/0001712 A1 * | 1/2002 | Higuchi | 428/336 |
| 2002/0008606 A1 * | 1/2002 | Okuyama et al. | 336/200 |
| 2004/0022009 A1 * | 2/2004 | Galvagni et al. | 361/306.3 |
| 2004/0065986 A1 * | 4/2004 | Otsuka | 264/614 |
| 2004/0145443 A1 * | 7/2004 | Shoji | 336/200 |
| 2004/0174656 A1 * | 9/2004 | MacNeal et al. | 361/306.3 |
| 2004/0197973 A1 * | 10/2004 | Ritter et al. | 438/200 |
| 2004/0257748 A1 * | 12/2004 | Ritter et al. | 361/306.3 |
| 2004/0262033 A1 * | 12/2004 | Chiu et al. | 174/256 |
| 2005/0118969 A1 * | 6/2005 | Shoji | 455/213 |
| 2005/0181684 A1 * | 8/2005 | Ito et al. | 439/894 |
| 2005/0207090 A1 * | 9/2005 | Kuriyama | 361/271 |
| 2005/0269700 A1 * | 12/2005 | Farnworth et al. | 257/737 |
| 2006/0022771 A1 * | 2/2006 | Ji | 333/185 |

FOREIGN PATENT DOCUMENTS

| | | |
|---|---|---|
| JP | A-06-096940 | 4/1994 |
| JP | A-6-151180 | 5/1994 |
| JP | A-07-201634 | 8/1995 |
| JP | A 8-203737 | 8/1996 |
| JP | A-8-335517 | 12/1996 |
| JP | A-11-265823 | 9/1999 |
| JP | A-11-340041 | 12/1999 |
| JP | A-2000-348941 | 12/2000 |
| JP | A-2001-006936 | 1/2001 |
| JP | A-2002-141235 | 5/2002 |
| JP | A-2005-116647 | 4/2005 |

* cited by examiner

ELECTRONIC COMPONENT AND METHOD OF MANUFACTURING THE SAME

BACKGROUND OF THE INVENTION

1. Field of the Invention

The present invention relates to a surface mount type electronic component mounted on a printed circuit board or hybrid IC (HIC) and a method of manufacturing the same.

2. Description of the Related Art

Known coil components mounded on circuits in electronic apparatus such as personal computers and portable telephones include wire-wound types provided by wounding a copper wire around a ferrite core, stacked types provided by stacking magnetic sheets made of ferrite having a coil conductor pattern formed thereon one over another, and thin film types provided by alternately forming insulation films and coil conductors constituted by metal thin films using thin film forming techniques. The rapid advance toward electronic components having smaller sizes and higher performance in recent years is accompanied by strong demand for coil components having smaller sizes and higher performance. In the case of thin film type coil components, chip size coil components of 1 mm or less are supplied to the market by reducing the thickness of coil conductors.

Patent Document 1 discloses a common mode choke coil as a thin film type coil component. FIG. 4 is an external perspective view of a common mode choke coil 51 according to the related art disclosed in Patent Document 1. In FIG. 4, for easier understanding, visible regions of outer external electrodes 61, 63, 65, and 67 are indicated by hatching, and internal electrode terminals 71 and 73 and features in the neighborhood of the same, which are covered by the external electrodes 61 an 63 and are not visible in practice, are shown in perspective representation. Hidden lines are represented by broken lines.

As shown in FIG. 4, the common mode choke coil 51 has an overall shape in the form of a rectangular parallelepiped that is provided by forming an insulation layer 57 and a coil layer (not shown) formed with a coil conductor in the order listed on a magnetic substrate 53 using thin film forming techniques and combining the resultant stack with another magnetic substrate 55 with a bonding layer 59 interposed between them. The internal electrode terminals 71, 73, 75, and 77 exposed at side portions of the insulation layer 57 are electrically connected to the external electrodes 61, 63, 65, and 67, respectively. The external electrodes 61, 63, 65, and 67 are formed at the respective side portions where the internal electrode terminals 71, 73, 75 and 77 are exposed such that they extend also on the top and bottom of the magnetic substrates 53 and 55 which are substantially perpendicular to the side portions and substantially parallel to the surface where the insulation layer 57 is formed.

Patent Document 1: JP-A-8-203737

The common mode choke coil 51 is completed through a thin film formation step at which the insulation layer 57 and the coil layer are formed on the magnetic substrate 53 in the form of a wafer using thin film forming techniques such as a photo-process, a substrate bonding step at which the magnetic substrate 55 is bonded using the bonding layer 59 formed on the insulation layer 57, a cutting step at which the wafer is cut and separated into chips, and an external electrode forming step at which the external electrodes 61, 63, 65, and 67 are formed. Since a plurality of manufacturing steps are required to manufacture the common mode choke coil 51 as thus described, a problem arises in that the common mode choke coil 51 becomes expensive because of high manufacturing costs. The external electrodes 61, 63, 65, and 67 are formed using, for example, a masked sputtering process. However, it is difficult to form external electrodes 61, 63, 65, and 67 having the shape shown in FIG. 4 on a common mode choke coil 51 smaller than a 1005 type component (the length of which is 1.0 mm along longer sides thereof and 0.5 mm along shorter sides thereof) because of limitations on mask registration accuracy and etc.

It is an object of the invention to provide an electronic component which can be formed with a small size and a low height at a low cost and a method of manufacturing the same.

SUMMARY OF THE INVENTION

The above-described object is achieved by an electronic component incorporating a passive element, characterized in that it includes a first conductive layer electrically connected to the passive element, a top insulation layer formed on the first conductive layer, and an external electrode which is electrically connected to the first conductive layer through a contact hole formed in the top insulation layer and which is formed to spread on a top surface of the top insulation layer.

The electronic component according to the invention is characterized in that it includes a first insulation layer formed between the first conductive layer and the top insulation layer and a second conductive layer electrically connected to the first conductive layer through a contact hole formed in the first insulation layer and in that the external electrode is electrically connected to the first conductive layer through the second conductive layer.

The electronic component according to the invention is characterized in that it includes a second insulation layer formed between the second conductive layer and the top insulation layer and a third conductive layer electrically connected to the second conductive layer through a contact hole formed in the second insulation layer and in that the external electrode is electrically connected to the first conductive layer through the second and the third conductive layers.

The electronic component according to the invention is characterized in that it includes a third insulation layer formed between the third conductive layer and the top insulation layer and a fourth conductive layer electrically connected to the third conductive layer through a contact hole formed in the third insulation layer and in that the external electrode is electrically connected to the first conductive layer through the second to the fourth conductive layers.

The electronic component according to the invention is characterized in that the first to the fourth conductive layers are formed from at least any of copper, aluminum, silver, and gold and in that the external electrode is formed from silver or gold.

The electronic component according to the invention is characterized in that a bottom insulation layer is formed under the first conductive layer.

The electronic component according to the invention is characterized in that the bottom insulation layer is formed on a substrate.

The electronic component according to the invention is characterized in that the first to the fourth conductive layers are not exposed at a side surface of the first to the third insulation layers and the top insulation layer.

The electronic component according to the invention is characterized in that the first to the fourth conductive layers are exposed at a side surface of the first to the third insulation layers and the top insulation layer.

The electronic component according to the invention is characterized in that the passive element is a common mode choke coil.

The above-described object is achieved by a method of manufacturing an electronic component incorporating a passive element, characterized in that it includes the steps of forming a first conductive layer on a substrate, forming a top insulation layer on the first conductive layer, forming a contact hole in the top insulation layer on the first conductive layer, and forming an external electrode which is electrically connected to the first conductive layer through the contact hole and which spreads on a top surface of the top insulation layer.

The method of manufacturing an electronic component according to the invention is characterized in that it includes the steps of forming a first insulation layer between the first conductive layer and the top insulation layer, forming a contact hole in the first insulation layer on the first conductive layer, forming a second conductive layer electrically connected to the first conductive layer through the contact hole, and electrically connecting the external electrode to the first conductive layer through the second conductive layer.

The method of manufacturing an electronic component according to the invention is characterized in that it includes the steps of forming a second insulation layer between the second conductive layer and the top insulation layer, forming a contact hole in the second insulation layer on the second conductive layer, forming a third conductive layer electrically connected to the second conductive layer through the contact hole, and electrically connecting the external electrode to the first conductive layer through the second and the third conductive layers.

The method of manufacturing an electronic component according to the invention is characterized in that it includes the steps of forming a third insulation layer between the third conductive layer and the top insulation layer, forming a contact hole in the third insulation layer on the third conductive layer, forming a fourth conductive layer electrically connected to the third conductive layer through the contact hole, and electrically connecting the external electrode to the first conductive layer through the second to the fourth conductive layers.

The method of manufacturing an electronic component according to the invention is characterized in that the first to the fourth conductive layers are formed from at least any of copper, aluminum, silver, and gold and in that the external electrode is formed from silver or gold.

The method of manufacturing an electronic component according to the invention is characterized in that a bottom insulation layer is formed between the substrate and the first conductive layer.

The method of manufacturing an electronic component according to the invention is characterized in that the first to the fourth conductive layers are not exposed at a side surface of the first to the third insulation layers and the top insulation layer even when the substrate is cut.

The method of manufacturing an electronic component according to the invention is characterized in that it includes the step of cutting the substrate to expose the first to the fourth conductive layers at a side surface of the first to the third insulation layers and the top insulation layer.

The method of manufacturing an electronic component according to the invention is characterized in that it includes the step of removing the substrate.

The method of manufacturing an electronic component according to the invention is characterized in that a common mode choke coil is formed as the passive element.

The invention makes it possible to manufacture a compact and low height electronic component at a low cost.

DETAILED DESCRIPTION OF THE INVENTION

Figure 1:
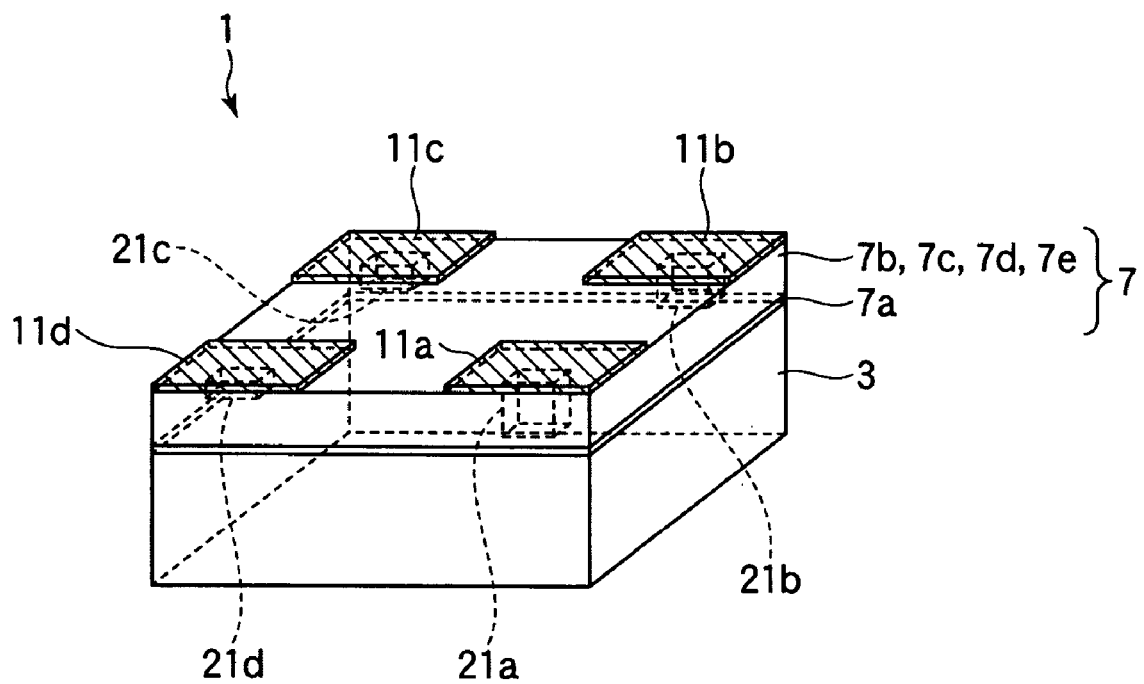
FIG. 1 is an external perspective view of a common mode choke coil 1 as an electronic component according to an embodiment of the invention.

An electronic component and a method of manufacturing the same according to an embodiment of the invention will now be described with reference to FIGS. 1 to 3. The present embodiment will be described with reference to a common mode choke coil for suppressing a common mode current which can cause electromagnetic interference in a balanced transmission system, as an example of an electronic component incorporating a passive element. FIG. 1 is an external perspective view of a common mode choke coil 1.

The common mode choke coil 1 shown in FIG. 1 has an overall shape in the form of a rectangular parallelepiped that is provided, for example, by forming an insulation layer 7 and a coil layer (not shown), and external electrodes 11a, 11b, 11c, and 11d in the order listed on a silicon substrate 3 using thin film forming techniques. The coil layer is formed with a coil conductor. The coil conductor is included in the insulation layer 7. The coil conductor is electrically connected to the external electrodes 11a to 11d. The top surface of the rectangular parallelepiped shape or the top surface of the insulation layer 7 on which the external electrodes 11a to 11d spread constitutes a mounting surface at which the component can be mounted to a printed circuit board (PCB) in a face-to-face relationship. For example, the mounting surface is formed with a length of 0.6 mm on longer sides thereof and a length of 0.3 mm on shorter sides thereof. The common mode choke coil 1 is a surface mount component of what is called "0603 type". For example, the external electrodes 11a to 11d are formed in a rectangular shape having a length of 0.2 mm on the longer sides of the mounting surface and a length of 0.1 mm on the shorter sides of the mounting surface, and they are disposed at the corners of the mounting surface. Each of the external electrodes 11a to 11d is formed to occupy a relatively great area or about 1/9 of the area of the mounting surface. Therefore, the common mode choke coil 1 can be provided with sufficient strength from the viewpoint of electrical connection and mounting to a PCB. The external electrodes 11a to 11d are formed from, for example, gold (Au) or silver (Ag) to keep them resistant to corrosion even when exposed to the atmosphere for a long time. A chamfering process may be performed on corners of the outline of the common mode choke coil 1 and lines along which adjacent surfaces of the coil meet each other.

The external electrodes 11a, 11b, 11c, and 11d are electrically connected to internal electrode terminals 21a, 21b, 21c, and 21d, respectively. For example, the internal electrode terminals 21a to 21d are formed from copper (Cu) in the form of a rectangular parallelepiped. As will be described later with reference to FIG. 2, the internal electrode terminal 21a has a four-layer structure provided by forming a conductive layer (first conductive layer) 41a, a conductive layer (second conductive layer) 43a, a conductive layer (third conductive layer) 45a, and a conductive layer (fourth conductive layer) 47a one over another. The internal electrode terminal 21b has a three-layer structure provided by forming a conductive layer (first conductive layer) 43b, a conductive layer (second conductive layer) 45b, and a conductive layer (third conductive layer) 47b one over another. The internal electrode terminal 21c has a two-layer structure provided by forming a conductive layer (first conductive layer) 45c and a conductive layer (second conductive layer) 47c one over another. The internal electrode terminal 21d has a single-layer structure constituted only by a conductive layer (first conductive layer) 47. Therefore, the internal electrode terminal 21a is greatest in thickness; the internal electrode terminal 21b is in the second place in thickness; the internal electrode terminal 21c is in the third place in thickness; and the internal electrode terminal 21d is smallest in thickness.

The internal electrode terminals 21a to 21d are formed smaller than the external electrodes 11a to 11d when viewed in a direction normal to the mounting surface, and they are disposed in the vicinity of respective corners of the insulation layer 7. Since the internal electrode terminals 21a to 21d are formed in relatively small areas, a sufficient area can be reserved for the formation of the coil conductor. As a result, the common mode choke coil 1 can be provided with high performance by, for example, providing the coil conductor with a great number of turns. Since the internal electrode terminals 21a to 21d are not exposed at side surfaces of the insulation layer 7, there is no concern about corrosion, and copper (Cu) or aluminum (Al) which has high electrical conductivity and processibility can therefore be used as a material to form the internal electrode terminals 21a to 21d and the coil conductor.

As will be described later with reference to FIG. 2, the insulation layer 7 has a multi-layer structure provided by forming an insulation layer (bottom insulation layer) 7a, an insulation layer (first insulation layer) 7b, an insulation layer (second insulation layer) 7c, an insulation layer (third insulation layer) 7d, and an insulation layer (top insulation layer) 7e one over another. The insulation layers 7a to 7e are formed by patterning a material having high insulating properties and processibility such as polyimide resin or epoxy resin or alumina ($Al_2O_3$) for maintaining the strength of the common mode choke coil 1 in a predetermined shape. When a silicon substrate 3 is used, the insulation layer 7a may be an oxide film formed on a film forming surface of the silicon substrate 3. In the common mode choke coil 1, a magnetic substrate formed from a magnetic material such as sintered ferrite or composite ferrite may be used instead of the silicon substrate 3.

As described above, the external electrodes 11a to 11d of the common mode choke coil 1 of the present embodiment are formed at thin film forming steps, and they are not formed using a masked sputtering process unlike those in the common mode choke coil 51 according to the related art. Since the common mode choke coil 1 is free from limitations put by mask registration accuracy and the like, the external electrodes 11a to 11d can be accurately formed in small areas. Therefore, the common mode choke coil 1 can be formed smaller than a 1005 type component. Further, the common mode choke coil 1 can be provided with a low height unlike the common mode choke coil 51 according to the related art which has the two magnetic substrates 53 and 55 provided opposite to each other.

A method of manufacturing an electronic component according to the present embodiment will now be described with reference to FIG. 2 by taking the common mode choke coil 1 as an example. A multiplicity of common mode choke coils 1 are simultaneously formed on a wafer, and FIG. 2 is an exploded oblique view of a multi-layer structure of an element forming region of one of the common mode choke coils 1.

Figure 2:
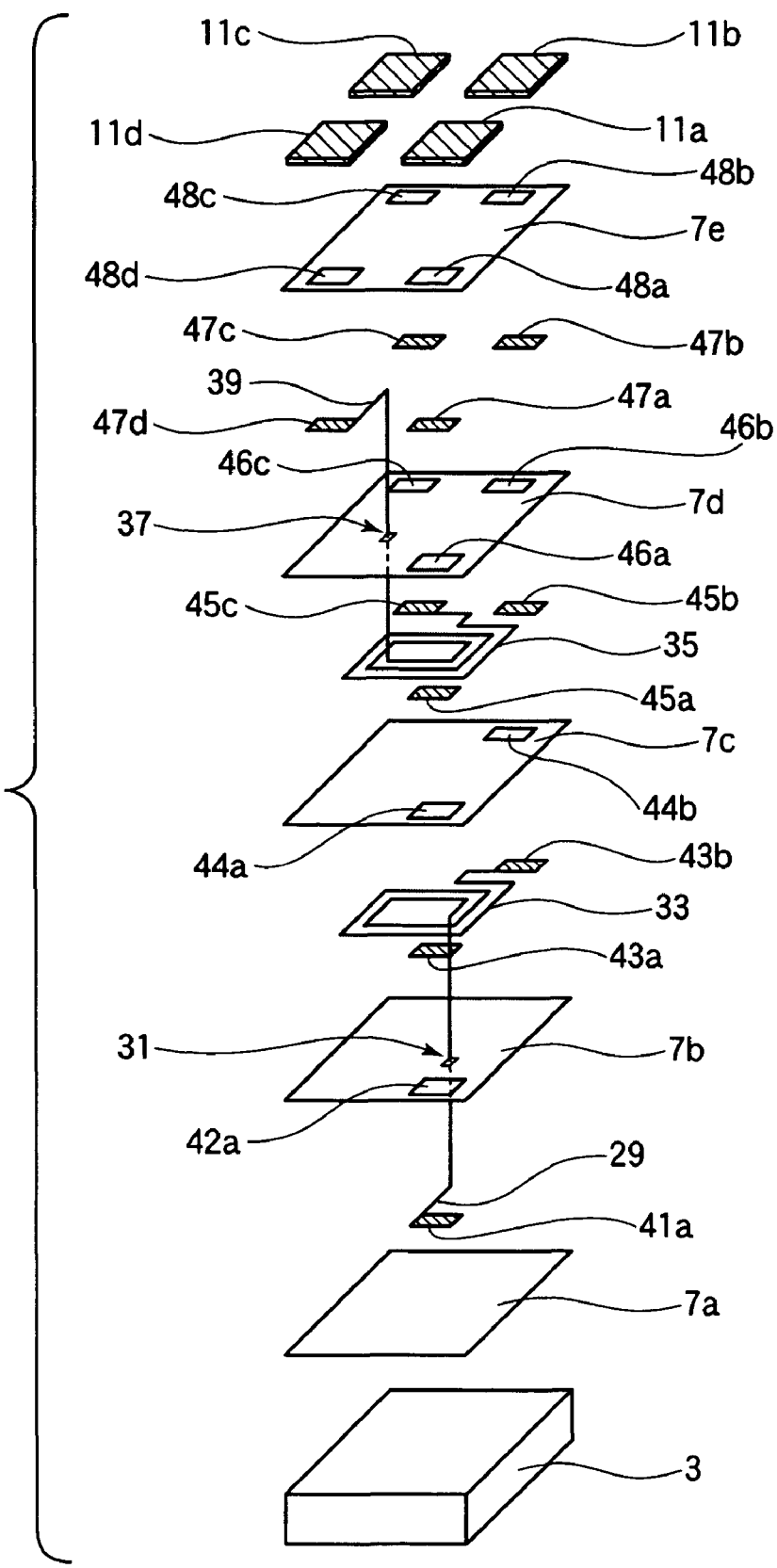
FIG. 2 is an exploded perspective view of the common mode choke coil 1 as an electronic component shown to explain a method of manufacturing an electronic component according to the embodiment of the invention.
Figure 3:
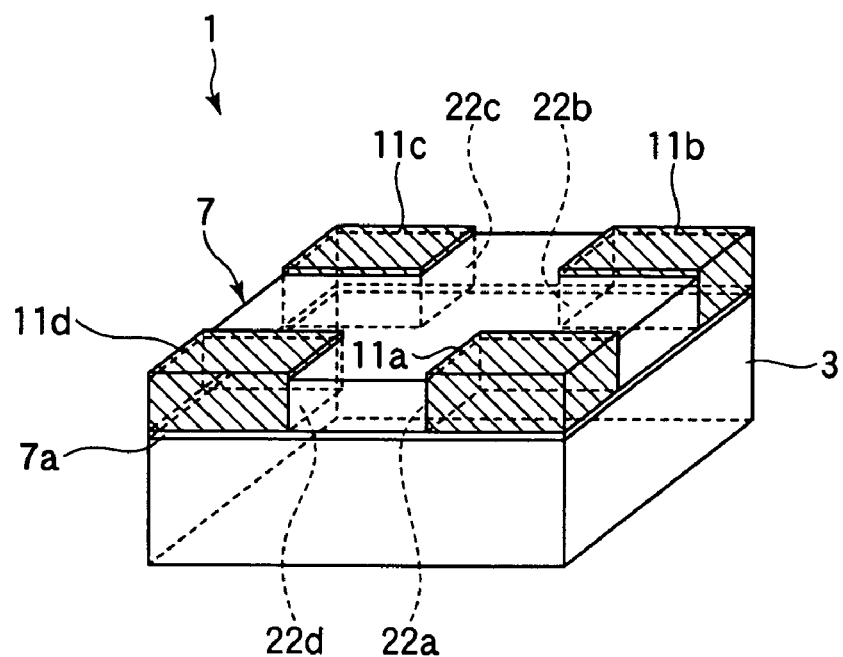
FIG. 3 is an external perspective view of a modification of the common mode choke coil 1 as an electronic component according to the embodiment of the invention.
Figure 4:
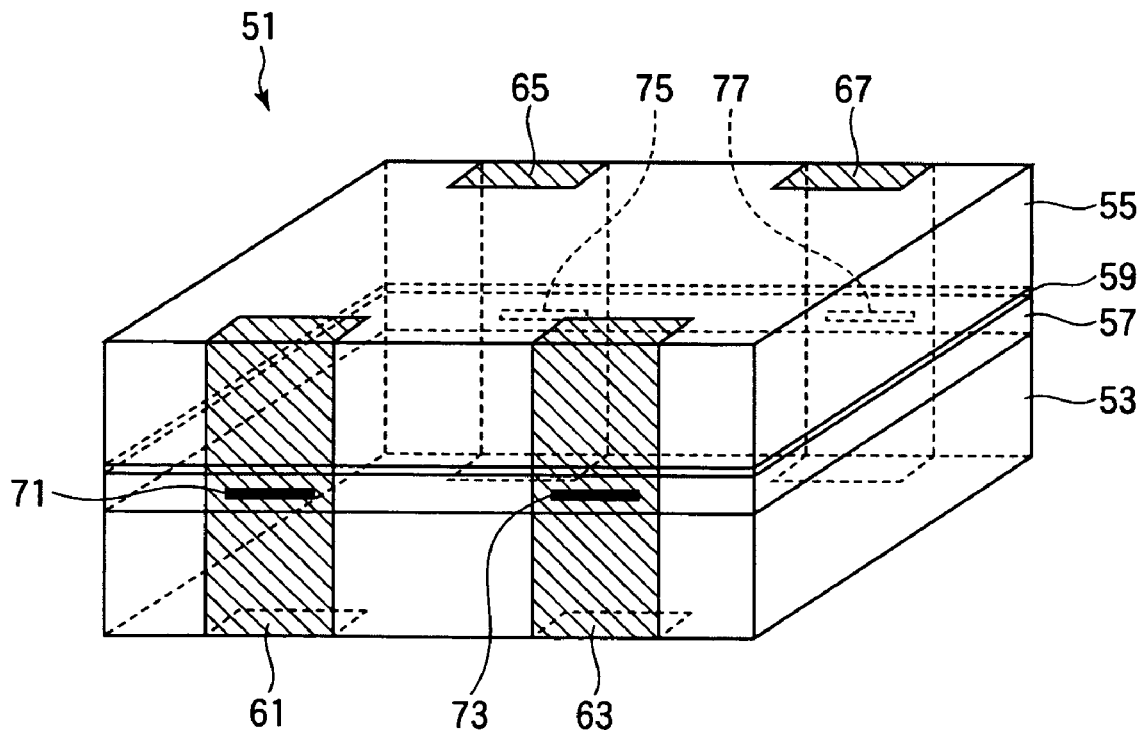
FIG. 4 is an external perspective view of a common mode choke coil 51 according to the related art.

First, as shown in FIG. 2, an insulation layer (bottom insulation layer) 7a is formed on a silicon substrate 3 by, for example, applying polyimide resin to the substrate. The insulation layer 7a is formed using a spin coating method, dipping method, spraying method, or printing method. Each of insulation layers to be described later will be formed using the same method as used for the insulation layer 7a. For example, a thermal process may be performed on the surface of the silicon substrate 3 instead of applying the polyimide resin, and an oxide film thus formed may be used as the insulation layer 7a.

Next, a metal layer (e.g., a Cu layer), which is not shown, is formed throughout the surface using a vacuum film forming method (deposition or sputtering and the like) or plating method, and the Cu layer is then patterned using an etching method or additive method employing photolithography or using a pattern plating method to form a conductive layer (first conductive layer) 41a which is located inside an element forming, region of the silicon substrate 3. At the same time, a lead 29 connected to the conductive layer 41a is formed. Each of Cu layers to be described later will be formed and patterned using the same methods as used for the conductive layer 41a. The material of the metal layer is not limited to Cu, and Au or Ag may alternatively be used.

Next, polyimide resin is applied throughout the surface of the layer and patterned to form an insulation layer (first insulation layer) 7b having a contact hole 42a at which a top surface of the conductive layer 41a is exposed and a contact hole 31 at which an end of the lead 29 on the side thereof unconnected to the conductive layer 41a is exposed.

Next, a Cu layer (not shown) is formed throughout the surface to form a coil conductor 33 having a spiral pattern on the insulation layer 7b. At the same time, a conductive layer (second conductive layer) 43a electrically connected to the conductive layer 41a is formed on the conductive layer 41a. Further, a conductive layer (first conductive layer) 43b is also simultaneously formed on the insulation layer 7b, the conductive layer being located inside the element forming region of the silicon substrate 3 and opposite to conductive layer 43a such that the coil conductor 33 is sandwiched between them. One terminal of the coil conductor 33 is connected to the lead 29 exposed at the contact hole 31, and another terminal of the same is formed in connection to the conductive layer 43b. Thus, the conductive layers 41a and 43a and the conductive layer 43b are electrically connected through the coil conductor 33.

Next, polyimide resin is applied throughout the surface and patterned to form an insulation layer (second insulation layer) 7c having contact holes 44a and 44b at which top surfaces of the conductive layers 43a and 43b are exposed respectively. A Cu layer (not shown) is then formed throughout the surface to provide a coil conductor 35 having a spiral pattern on the insulation layer 7c. At the same, a conductive layer (third conductive layer) 45a electrically connected to the conductive layer 43a is formed on the conductive layer 43a, and a conductive layer (second conductive layer) 45b electrically connected to the conductive layer 43b is formed on the conductive layer 43b. Further, a conductive layer (first conductive layer) 45c is simultaneously formed on the insulation layer 7c, the conductive layer being located inside the element forming region of the silicon substrate 3 so as to extend in the direction of longer sides of the element forming region (the left-to-right direction in the figure) opposite to the conductive layer 45b. The conductive layer 45c is formed in connection to one terminal of the coil conductor 35.

Next, polyimide resin is applied throughout the surface and patterned to form an insulation layer (third insulation layer) 7d having contact holes 46a, 46b, and 46c at which top surfaces of the conductive layers 45a, 45b, and 45c are exposed respectively and a contact hole 37 at which another terminal of the coil conductor 35 is exposed.

Next, a Cu layer (not shown) is formed throughout the surface and patterned to form a conductive layer (fourth conductive layer) 47a electrically connected to the conductive layer 45a on the conductive layer 45a, a conductive layer (third conductive layer) 47b electrically connected to the conductive layer 45b on the conductive layer 45b, and a conductive layer (second conductive layer) 47c electrically connected to the conductive layer 45c on the conductive layer 45c. At the same time, a conductive layer (first conductive layer) 47d is formed on the insulation layer 7d, the conductive layer being located inside the element forming region of the silicon substrate 3 and opposite to the conductive layer 47c such that the coil conductor 35 is sandwiched between them. Further, a lead 39 is simultaneously formed on the insulation layer 7d for electrically connecting the conductive layer 47d and the other terminal of the coil conductor 35 exposed at the contact hole 37. Thus, the conductive layers 45c and 47c and the conductive layer 47d are electrically connected through the coil conductor 35 and the lead 39.

Next, polyimide resin is applied throughout the surface and patterned to form an insulation layer (top insulation layer) 7e having contact holes 48a, 48b, 48c, and 48d at which top parts of the conductive layers 47a, 47b, 47c, and 47d are exposed respectively. An Au layer (not shown) is then formed throughout the surface and patterned to form external electrodes 11a to 11d which are electrically connected to the conductive layers 47a to 47d, respectively, and which spread on the insulation layer 7e. Thus, the external electrode 11a is electrically connected to the conductive layer 41a through the conductive layers 43a, 45a, and 47a. The external electrode 11b is electrically connected to the conductive layer 43b through the conductive layers 45b and 47b. The external electrode 11c is electrically connected to the conductive layer 45c through the conductive layer 47c. The external electrode 11d is electrically connected to the conductive layer 47d. An internal electrode terminal 21a is formed by the conductive layers 41a, 43a, 45a, and 47a which are stacked one over another. An internal electrode terminal 21b is formed by the conductive layers 43b, 45b, and 47b which are stacked one over another. An internal electrode terminal 21c is formed by the conductive layers 45c and 47c which are stacked one over another. An internal electrode 21d is formed only by the conductive layer 47d.

Then, the wafer is cut along predetermined cutting lines to separate the plurality of coil elements formed on the wafer into chips each constituted by an element forming region. Since the internal electrode terminals 21a to 21d are formed inside the element forming region, they are not exposed at side surfaces of the insulation layer 7 along which the layer is cut. Next, corners are chamfered to complete common mode choke coils 1.

As described above, the external electrodes 11a to 11d of the present embodiment can be formed at the same time when thin film forming steps are performed to form the coil conductors 33 and 35, the internal electrode terminals 21a to 21d, and the insulation layer 7. As a result, the steps for manufacturing the common mode choke coil 1 can be simpler than those for the common mode choke coil 51 according to the related art. Since manufacturing costs can therefore be reduced, the common mode choke coil 1 can be provided at a low cost.

A common mode choke coil 1 according to a modification of the present embodiment will now be described with reference to FIG. 3. FIG. 3 is an external perspective view of the common mode choke coil 1 of the present modification. As shown in FIG. 3, the common mode choke coil 1 of the present modification is characterized in that internal electrode terminals 22a, 22b, 22c, and 22d are exposed also at side surfaces of an insulation layer 7. Any of the internal electrode terminals 22a to 22d of the common mode choke coil 1 of the present modification has a four-layer structure similar to that of the internal electrode terminal 21a of the common mode choke coil 1 shown in FIG. 1.

Since the internal electrode terminals 22a to 22d are formed in substantially the same size as external electrodes 11a to 11d, each of the terminals is exposed at one side surface of the insulation layer 7 so as to occupy an area which is as relatively great as about one-third of the side surface. The exposed parts of the internal electrode terminals 22a to 22d can be used, along with the external terminals 11a to 11d, as soldering regions for mounting the common mode choke coil 1 on a PCB. Therefore, the common mode choke coil 1 of the present modification can be mounted with improved strength compared to the common mode choke coil 1 shown in FIG. 1. In the common mode choke coil 1 of the present modification, the internal electrode terminals 22a to 22d may be formed from Au or Ag to prevent the corrosion of the exposed parts.

The method of manufacturing the common mode choke coil 1 of the present modification will not be described because it is the same as the method of manufacturing the common mode choke coil 1 shown in FIG. 2 except that the internal electrode terminals 22a to 22d are formed in substantially the same size as the external electrodes 11a to 11d; the internal electrode terminals 22a to 22d have a four-layer structure provided by forming the first to fourth conductive layers one over another; and the internal electrode terminals 22a to 22d are exposed at side surfaces (cut surfaces) of the insulation layer 7 when the wafer is cut along predetermined cutting lines.

The invention is not limited to the above-described embodiment and may be modified in various ways.

Although the common mode choke coil 1 of the above-described modification has a configuration in which the internal electrode terminals 22a to 22d are formed in substantially the same size as the external electrodes 11a to 11d and exposed at side surfaces of the insulation layer 7, the invention is not limited to the configuration. For example, the internal electrode terminals may be formed smaller than the external electrodes 11a to 11d like the internal electrode terminal 21a, and they may be formed such that their surfaces exposed at side surfaces of the insulation 7 are L-shaped when the element forming region is viewed in a direction normal thereto. In this case, since the internal electrode terminals can be formed in relatively small areas, the performance of the common mode choke coil 1 can be improved just as in the above-described embodiment.

The internal electrode terminals may be formed in a sheet-like configuration such that they are exposed at least on opposite side surfaces of the insulation layer 7 and such that the internal electrode terminals and the respective external electrodes 11a to 11d form an L-like sectional shape. In this case again, since the internal electrode terminals can be formed in relatively small areas, the performance of the common mode choke coil 1 can be improved just as in the above-described embodiment.

Although reference has been made to polyimide resin as an example of a material to form the insulation layer 7 in the description of the method of manufacturing a common mode choke coil 1 according to the above embodiment, the invention is not limited to the same. For example, $Al_2O_3$ may be used as the material to form the insulation layer 7. For example, the insulation layers 7a to 7e may be formed from $Al_2O_3$ using the sputtering method. Since $Al_2O_3$ has relatively high mechanical strength, the strength of the common mode choke coil 1 can be maintained at a predetermined level even if, for example, the silicon substrate 3 is polished away from the insulation layer 7 after thin film forming steps. Thus, the height of the common mode choke coil 1 can be reduced further.

Since $Al_2O_3$ is a non-magnetic material, it is desirable to form a closed magnetic path penetrating through the coil conductors 33 and 35 in the insulation layer 7 in order to provide the common mode choke coil 1 with high performance. For example, the closed magnetic path may be formed by a magnetic material embedded by removing part of the insulation layer 7 on an inner circumferential side and outer circumferential side of the coil conductors 33 and 35 and a pair of magnetic layers sandwiching the coil conductors 33 and 35 in magnetic contact with the magnetic material. The silicon substrate 3 may be replaced by a magnetic substrate, and the magnetic substrate may be used instead of one of the pair of magnetic layers.

Although reference was made to the common mode choke coil 1 as an example to describe an electronic component and a method of manufacturing the same according to the above embodiment, the invention is not limited to the same. For example, an electronic component incorporating a passive element may be constituted by a first conductive layer formed on a bottom insulation layer, a thin film resistive element electrically connected to the first conductive layer, a top insulation layer on which a top part of the first conductive layer is exposed, and an external electrode which is electrically connected to the first conductive layer and which spreads on a top surface of the top insulation layer. Since the electronic component includes the thin film resistive element, a compact and low height resistor formed with an external electrode can be provided using only thin film forming steps.

For example, an electronic component incorporating a passive element may be constituted by a first insulation layer on which a top part of a first conductive layer is exposed, a spiral coil conductor formed in the same layer as the first conductive layer and electrically connected to the first conductive layer, a second conductive layer electrically connected to the first conductive layer through the part of the first conductive layer exposed on the first insulation layer, a top insulation layer on which a top part of the second conductive layer is exposed, and an external electrode which is electrically connected to the first conductive layer through the second conductive layer and which spreads on a top surface of the top insulation layer. Since the electronic component includes the coil conductor, a compact and low height inductor formed with an external electrode can be provided using only thin film forming steps.

For example, an electronic component incorporating a passive element may be constituted by a first insulation layer on which a top part of a first conductive layer is exposed, a first thin film sheet electrode formed in the same layer as the first conductive layer and electrically connected to the first conductive layer, a second conductive layer electrically connected to the first conductive layer through the part of the first conductive layer exposed on the first insulation layer, a second thin film sheet electrode formed on the first insulation layer, a top insulation layer on which a top part of the second conductive layer is exposed, and an external electrode which is electrically connected to the first conductive layer through the second conductive layer and which spreads on a top surface of the top insulation layer. In the electronic component, a capacitance is formed by the first and the second thin film sheet electrodes and the first insulation layer sandwiched by those electrodes. Thus, a compact and low height capacitor formed with an external electrode can be provided using only thin film forming steps.

Although the above embodiment was described with reference to the common mode choke coil 1 having four external electrodes by way of example, the invention is not limited to the same. For example, the invention may be applied to an electronic component having two external electrodes. Further, the invention may be applied to an array type electronic component that is a single package incorporating a plurality of passive elements.

What is claimed is:

1. An electronic component incorporating a passive element, comprising:
    a first conductive layer electrically connected to the passive element;
    a top insulation layer formed on the first conductive layer;
    an external electrode that is electrically connected to the first conductive layer through a contact hole formed in the top insulation layer and that is formed to spread only on a top surface of the top insulation layer such that the external electrode partially covers the top surface of the top insulation layer;
    a first insulation layer formed between the first conductive layer and the top insulation layer; and
    a second conductive layer electrically connected to the first conductive layer through a contact hole formed in the first insulation layer, wherein the external electrode is electrically connected to the first conductive layer through the second conductive layer,
    wherein the passive element is formed on the first insulation layer on which the second conductive layer is formed,
    the external electrode is a thin film patterned and formed by a thin film process,
    the electronic component has an overall shape of a rectangular parallelepiped, a longer side of the rectangular parallelepiped having a length less than 1.0 mm when viewed in a direction normal to the top insulating layer; and
    wherein the entirety of the passive element is formed on the first insulation layer.

2. An electronic component according to claim 1, comprising:
    a second insulation layer formed between the second conductive layer and the top insulation layer; and
    a third conductive layer electrically connected to the second conductive layer through a contact hole formed in the second insulation layer, wherein the external electrode is electrically connected to the first conductive layer through the second and the third conductive layers.

3. An electronic component according to claim 2, comprising:
    a third insulation layer formed between the third conductive layer and the top insulation layer; and
    a fourth conductive layer electrically connected to the third conductive layer through a contact hole formed in the third insulation layer, wherein the external electrode is electrically connected to the first conductive layer through the second to the fourth conductive layers.

4. An electronic component according to claim 3, wherein:
the first to the fourth conductive layers are formed from at least any of copper, aluminum, silver, and gold; and
the external electrode is formed from silver or gold.

5. An electronic component according to claim 1, wherein a bottom insulation layer is formed under the first conductive layer.

6. An electronic component according to claim 5, wherein the bottom insulation layer is formed on a substrate.

7. An electronic component according claim 3, wherein the first to the fourth conductive layers are not exposed at a side surface of the first to the third insulation layers and the top insulation layer, the first to the fourth conductive layers are stacked one over another so as to form an internal electrode terminal.

8. An electronic component according to claim 3, wherein the first to the fourth conductive layers are exposed at a side surface of the first to the third insulation layers and the top insulation layer, the first to the fourth conductive layers are stacked one over another so as to form an internal electrode terminal.

9. An electronic component according to claim 3, wherein the passive element is a common mode choke coil.

10. An electronic component according to claim 1, wherein the external electrode is disposed at a corner of the top insulating layer so as to make a side surface of the external electrode flush with a side surface of the top insulating layer.

11. An electronic component according to claim 1, wherein
the first conductive layer has a first exposed portion not covered with the external electrode,
the second conductive layer has a second exposed portion not covered with the external electrode, and
both the first exposed portion and the second exposed portion are exposed at a side surface of the first insulation layer and the top insulation layer, wherein the first and the second conductive layers are stacked one over another so as to form at least a part of an internal electrode terminal.

12. An electronic component according to claim 1, wherein the passive element is an inductor that includes more than 1 turn in the same layer.

* * * * *